US007029316B2

(12) United States Patent
Jackson, III

(10) Patent No.: US 7,029,316 B2
(45) Date of Patent: Apr. 18, 2006

(54) EYE GROUNDING CONTROLLER

(76) Inventor: Denton Jackson, III, 9170 Hwy. 51, Coldwater, MS (US) 38618

( * ) Notice: Subject to any disclaimer, the term of this patent is extended or adjusted under 35 U.S.C. 154(b) by 0 days.

(21) Appl. No.: 10/767,313

(22) Filed: Jan. 29, 2004

(65) Prior Publication Data

US 2005/0170684 A1 Aug. 4, 2005

(51) Int. Cl.
*H10R 13/00* (2006.01)

(52) U.S. Cl. .................................... 439/477; 174/40 R

(58) Field of Classification Search ................ 439/477, 439/478; 361/652, 673; 174/68, 72, 71 B
See application file for complete search history.

(56) References Cited

U.S. PATENT DOCUMENTS

| | | | | |
|---|---|---|---|---|
| 2,145,164 | A * | 1/1939 | Douglas | 439/569 |
| 2,650,286 | A * | 8/1953 | Ramos | 200/246 |
| 3,923,363 | A * | 12/1975 | Kraft | 439/413 |
| 4,178,470 | A * | 12/1979 | Jean et al. | 174/168 |
| 4,741,704 | A * | 5/1988 | DeLuca | 439/92 |
| 5,011,421 | A * | 4/1991 | Duke et al. | 439/213 |
| 5,515,236 | A * | 5/1996 | Nolan et al. | 361/652 |
| 6,043,433 | A * | 3/2000 | Schweitzer, Jr. | 174/70 R |
| 6,096,970 | A * | 8/2000 | Katoh et al. | 174/40 CC |
| 6,603,075 | B1 * | 8/2003 | Soares et al. | 174/72 B |
| 2002/0177353 | A1 * | 11/2002 | De France | 439/477 |
| 2004/0173436 | A1 * | 9/2004 | Baker | 198/370.08 |

* cited by examiner

*Primary Examiner*—Gary F. Paumen
*Assistant Examiner*—Phuongchi Nguyen
(74) *Attorney, Agent, or Firm*—Charles F. Rye

(57) ABSTRACT

A lifting and anti torque bracket to-be-attached to a clamp or other end termination of a temporary conductor In power distribution services the most common use of such a temporary conductor is a grounding set which is used to provide a conductive path between power lines as a safety ground. The bracket may be a separate retro fit assembly or may be made integral with grounding clamps or other end terminations. The bracket allows the grounding clamp to be lifted into position with relatively light extendable long reach poles commonly used by lineman. The anti torque feature helps resist the tendency for the clamps to cam off the line or other object the clamp has been placed on while the clamp is closed or opened.

11 Claims, 3 Drawing Sheets

EYE GROUNDING CONTROLLER

BACKGROUND OF THE INVENTION

This invention relates to providing a means to lift a temporary conductor into place and reducing the end terminations tendency to cam off the intended position while the clamping means of the temporary conductor is closed or opened. This invention also provides for the use of a common extendable stick that can be practically used for long reaches and especially to reach from the ground. The most common use of a temporary conductor in power distribution maintenance is safety grounding power lines together with a grounding set. Current practices include the use of Shot Gun Stick™ which attaches to the screw portion of a clamp of the grounding set to lift and place it on a power line. The weight of the means used to lift the grounding set and the limitation of the practical reach length generally requires the lineman to climb the power pole use a lift on a truck.

U.S. Pat. No. 1,712,067 filed by Bodendieck in 1926 is an early example of a clamp for a temporary conductor used in power transmission services. 067 does provide a ring to lift the clamp into place but does not provide an effective means to resist camming off the placement when the screw is manipulated.

U.S. Pat. No. 1,949,646 filed by Dibner in 1928 details a modification to the screw of the clamp however it requires a special end attachment to the lifting pole. The connection of the pole to the clamp requires a precise alignment which would be awkward if the clamp moves out of its original alignment relative to the position it was installed.

U.S. Pat. No. 1,934,126 filed by Johnson in 1926 also provides a unique method to attach a lifting pole to the clamp. Likewise it requires a special end attachment for the lifting pole and any shift in the position of the clamp from its original position would greatly increase the difficulty of reattaching the pole to unclamp. The position of the clamp could be effected by the weight of the grounding set in a twisting action on power line it is attached to.

U.S. Pat. No. 2,009,289 filed by Caird in 1932 attempted to provide stability to the clamp by use of spring action against the power line while the clamp is being manipulated. The spring extending on both sides would only provide its maximum resistance to camming off just before the clamp jaw actually seats against the power line. This design does not appear in currently available grounding sets.

U.S. Pat. No. 2,095,137 filed by Johnson in 1935 again requires a specialized lifting pole. The exposed hook may have allowed greater misalignment of the clamp from its original position. However the entire lifting pole is part of the mechanism which does not tend to lend itself to adjustable length and would probably be too heavy for long reaches.

SUMMARY OF THE INVENTION

This invention preferred embodiment is a bracket assembly that is adapted to be retro fitted onto clamps of grounding sets to provide an eye to lift the grounding set by and an anti-torque arm to resist the natural tendency of the clamp to cam off a power line while the clamp screw is being turned. The eye and the anti-torque arm may be incorporated into the clamp design in its original production.

This inventions greatest benefit is realized by allowing the use of a lightweight pole to position a grounding set on a power line by a lineman from the ground level. Grounding set as used by lineman in maintenance of power distribution system consists of an assembly of at least one length of flexible cable and a termination at each end. The end terminations usually consist of an adapted C clamp which can be placed over a power and closed on it to provide a conductive path. It is a very critical safety procedure to ground power lines when work being preformed requires the lineman to come in contact with or in close proximity to power lines which generally are bare. The grounding set may have end terminations specially adapted to attach to objects other than power lines.

The ability to lift, place and manipulate the clamping means of a grounding set on a power line from ground level allows the lineman to ground power lines in remote areas difficult to move a truck to and the lineman may be able to avoid climbing damaged poles would greatly enhance safety. It is therefore the most important object of this invention to provide a resistance to the tendency of the clamp to cam off the power line and accommodate the use a light long reach extension stick for positioning and manipulating the clamps of grounding sets. The invention may be adapted to specialized ground set terminations for unique attach points.

DETAILED DESCRIPTION OF THE DRAWINGS

Figure 1:
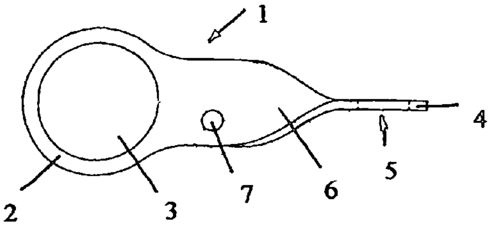
FIG. 1 is a side view of the bracket body.
Figure 5:
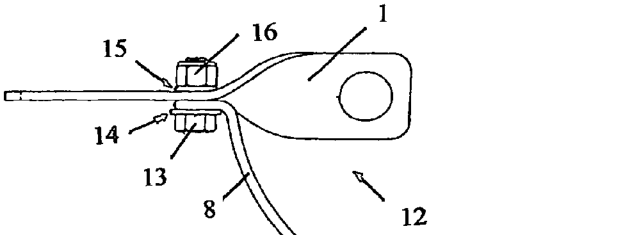
FIG. 5 is a side view of the bracket assembly.
Figure 6:
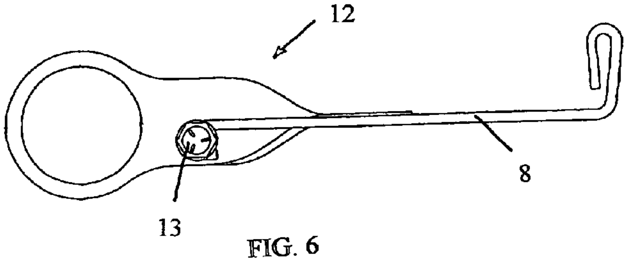
FIG. 6 is a top view of the bracket assembly.
Figure 11:
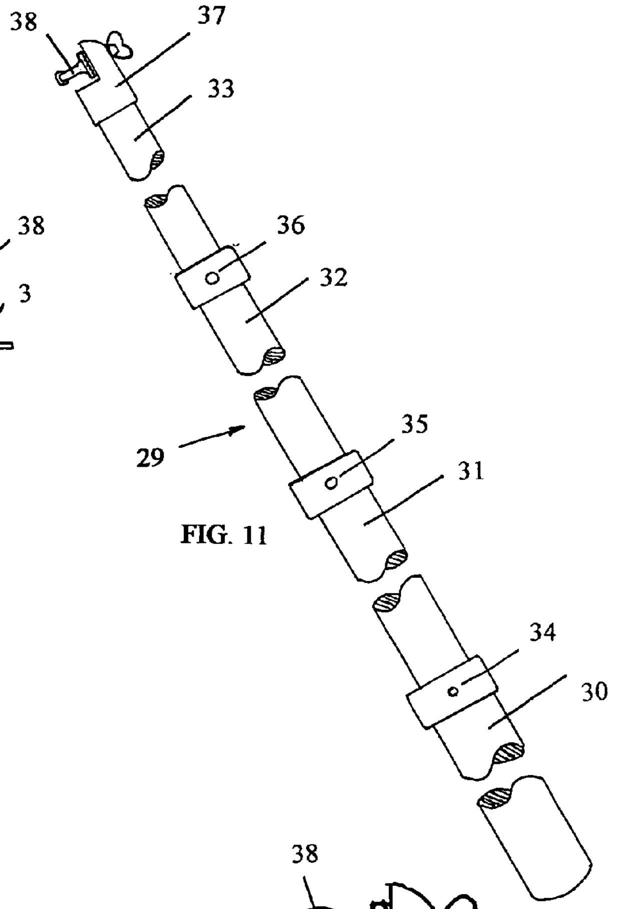
FIG. 11 is a side view of an extension stick.

FIG. 1 shows a side view of the bracket body 1. The first aperture 3 is located in first end 2 and is adaptive to receive L hook 38 (FIG. 11) of an extension stick 29 (FIG. 11). The second aperture 5 is located in the second end 4 and is adaptive to receive the cable bolt 25 (FIG. 6). The third aperture 7 is adaptive to receive bolt 13 (FIG. 5.). Middle region 6 is formed to index first end 2 approximately ninety degrees relative to second end 4.

Figure 2:
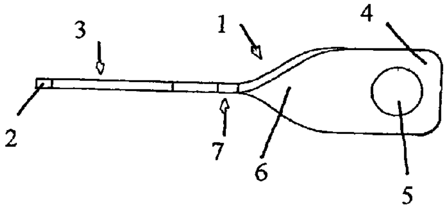
FIG. 2 is a top view of the bracket body.

FIG. 2 shows a top view of the bracket body 1. The respective features 2 through 7 are also shown.

Figure 3:
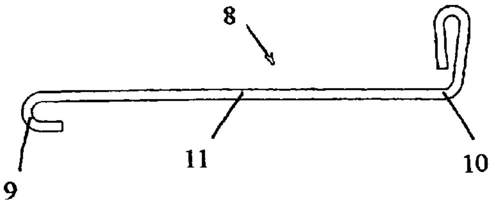
FIG. 3 is a side view of the anti torque arm.
Figure 7:
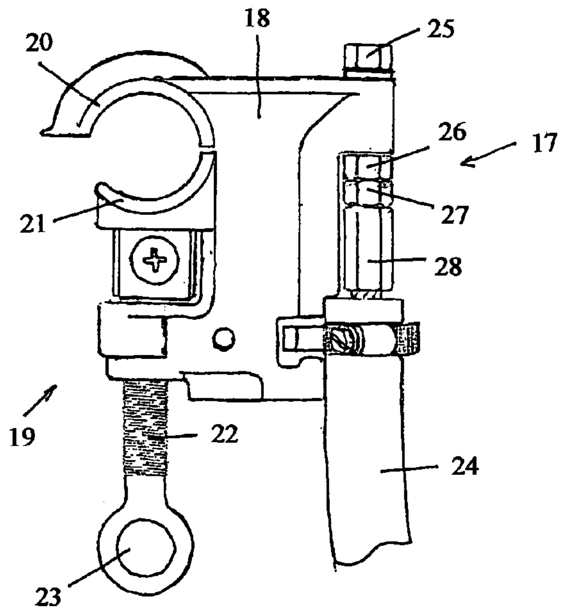
FIG. 7 is a side view of a ground set clamp.

FIG. 3 shows a side view of anti-torque arm 8. The arm first end 9 is formed to receive bolt 13 (FIG. 5). The arm second end 10 is formed to engage power line 39 (FIG. 15). The arm length 11 is formed to extend arm second end 10 away from clamp body 19 (FIG.7) and in line with fixed jaw 20 (FIG. 7).

Figure 4:
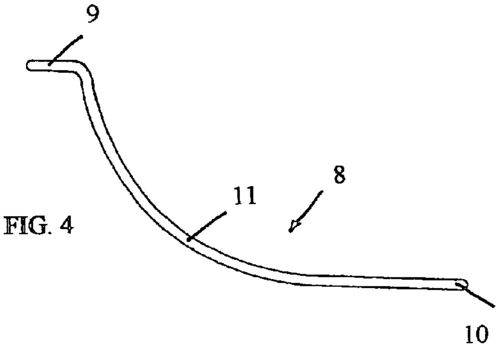
FIG. 4 is a top view of the anti-torque arm.

FIG. 4 shows a top view of anti-torque arm 8. The respective features 9 through 11 are also shown.

FIG. 5 shows a side view of bracket assembly 12. Bolt 13 passes through flat washer 14, anti-torque arm 8, and lock washer 15. Nut 16 is fastened to bolt 13.

FIG. 6 shows a top view of bracket assembly 12. The respective features 13 through 16 are also shown.

FIG. 7 shows a side view of one clamp 19 of grounding set 17 which has major components of clamp 19 and cable 24 and another clamp 19 at the other end of cable 24. The length of cable 24 and another clamp 19 are omitted from the figure as redundant. Screw eye 23 is rotated to advance or retract screw 22 which acts on movable jaw 21. Fixed jaw 20 is an integral part of clamp body 19 which also accepts cable bolt 25. Cable bolt 25 is held in position in clamp body 19 by lock nut 26. Cable end fitting 28 is screwed on to cable bolt 25 and is secured by holding nut 27.

Figure 8:
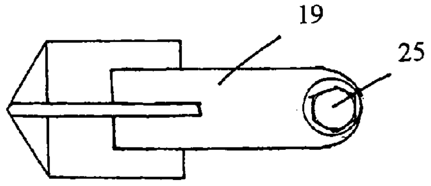
FIG. 8 is a top view of a ground set clamp.

FIG. 8 shows a top view of clamp 19 and cable bolt 25.

Figure 9:
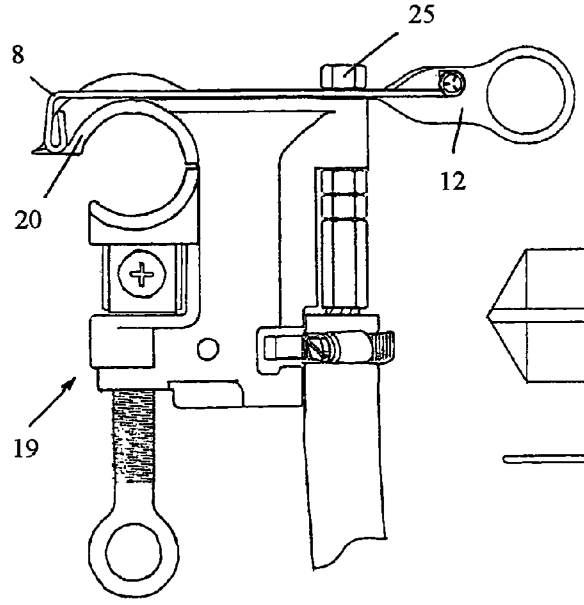
FIG. 9 is a side view of bracket assembly attached to a grounding set clamp.

FIG. 9 shows a top view of bracket assembly 12 attached to clamp 19 by cable bolt 25. Anti-torque arm 8 is aligned with fixed jaw 20.

Figure 10:
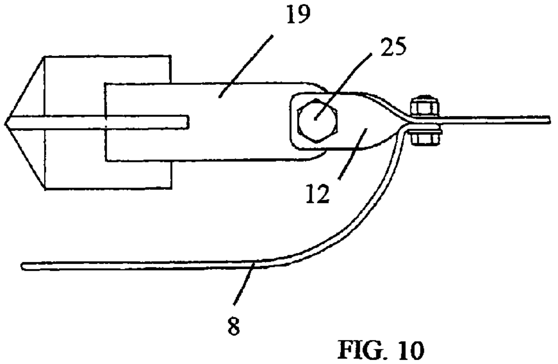
FIG. 10 is a top view of bracket assemby attached to grounding set clamp.

FIG. 10 shows a side view of bracket assembly 12 attached to clamp 19. Anti-torque arm 8 extends away from clamp 19.

FIG. 11 shows a side view of extension stick 29. Stick joint 30, 31, 32 and 33 are extended and locked into place by lock 34, 35 and 36 respectively. Manipulating end 37 has attachment L hook 38 fitted to it.

Figure 12:
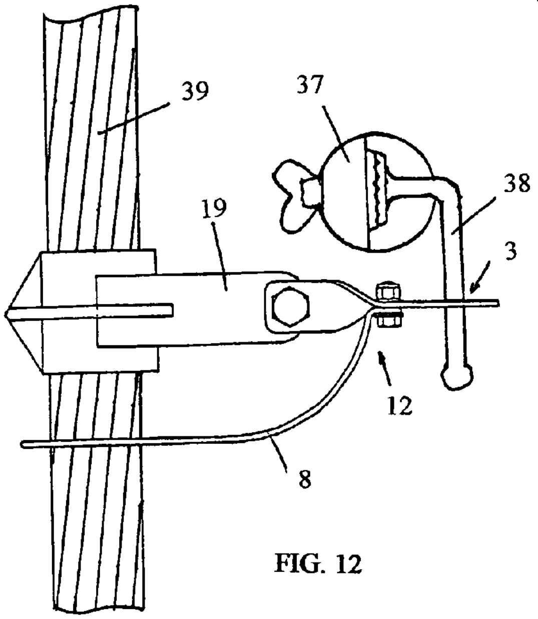
FIG. 12 is a top view of a grounding set clamp attached to a power line with a L hook attachment on an extension stick engaged in the eye of an Eye Grounding bracket.

FIG. 12 shows a top view of clamp 19 positioned on power line 39. Anti-torque arm 8 engages power line 39. L hook 38 engages first aperture 3 of bracket assembly 12 which allows grounding set 17 (FIG. 7) to be lifted by the manipulating end 37 of extension stick 29.

Figure 13:
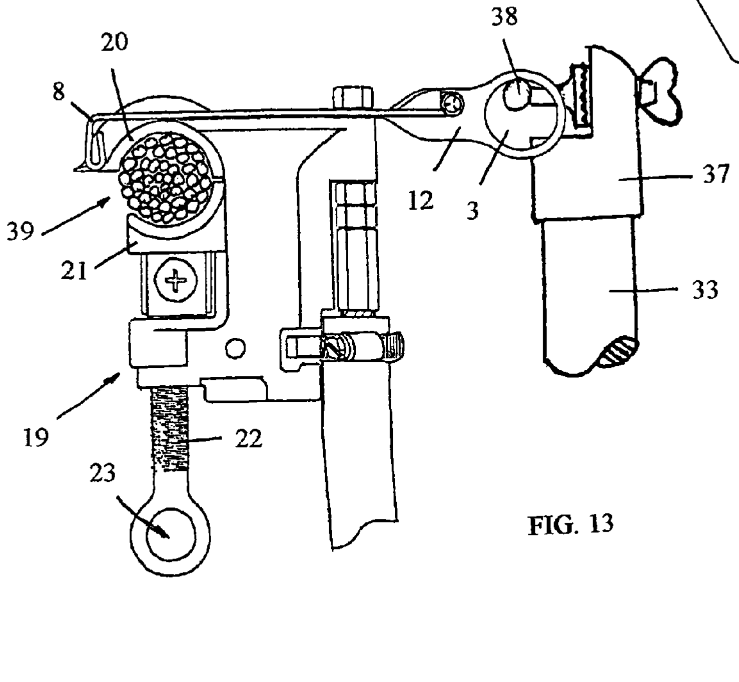
FIG. 13 is a top view of a grounding set clamp attached to a power line with a L hook attachment on an extension stick engaged in the eye of an Eye Grounding bracket.

FIG. 13 shows a top view of clamp 19 positioned on power line 39. Anti-torque arm 8 engages power line 39. L hook 38 engages first aperture 3 of bracket assembly 12 which allows grounding set 17 (FIG. 7) to be lifted by the manipulating end 37 of extension stick 29.

The preferred embodiment of this invention has been portrayed in the description and drawings and is not intended as a limitation on other adaptations of this invention. Those skilled in the art can envision various adaptations of this invention to accommodate other conductor terminations both temporary and permanent which would benefit from the use of this invention.

I claim:

1. An assembly for accommodating a manipulating means for lifting and positioning and actuating its clamping means on a power line or other conductor, comprising:

a lifting ring defining a first aperture of a predetermined diameter generally larger than the working end diameter of said manipulating means for receiving said manipulating means;

a rigid region radially extending from said lifting ring, said rigid region having a second aperture disposed there through, wherein said second aperture is adapted to receive a mounting means to rigidly attach said lifting ring to said clamping means;

said lifting ring and rigid region forming a unitarily formed body;

said rigid region proximate to the first aperture forms a first end and said rigid region proximate to said second aperture forms a second end and the rigid region between said first end and second end forms a middle area;

a conducting set, further comprising;

at least one length of conductor;

at least one end termination with clamping means mounted on each end of said conductor conductive to each other through said conductor; and a rigid mounting means mounting said lifting ring to said end terminations.

2. The assembly according to claim 1, wherein said body's middle area is generally parallel to said first end and said second end.

3. The assembly according to claim 1, wherein said body's middle area is formed to clock said first end a predetermined number of degrees relative to said second end generally on a reference axis of a line from the center of said aperture one to the center of said aperture two.

4. The assembly according to claim 1, wherein said body's middle area is formed to clock said first end a predetermined number of degrees relative to said second end generally on a first reference axis of a line from the center of said aperture one to the center of said aperture two; and said middle area is further formed a predetermined number of degrees generally on a second reference axis, generally in the center of said middle area and generally perpendicular to said first reference axis.

5. The assembly according to claim 1; wherein said rigid region consist of a clamp of a hot line wire assembly.

6. A bracket assembly for accommodating a manipulating means for lifting a hot line grounding set and positioning the clamps on a power line or other conductor and further provides stability to said clamp to resist camming off the object said clamp has been placed on while the attaching and releasing means of said clamp is manipulated, comprising:

a lifting ring defining a first aperture of a predetermined diameter for receiving said manipulating means;

a rigid region radially extending from said lifting ring, said rigid region having a second aperture disposed there through, wherein said second aperture is adapted to receive a mounting means to rigidly attach the mounting bracket assembly to said clamp;

said lifting ring and rigid region forming a unitarily formed body;

said rigid region proximate to aperture one forms a first end and said rigid region proximate to said aperture two forms a second end and the rigid region between said end one and end two forms a middle area;

an anti torque arm having a first end, a length and a second end;

said arm's first end is formed to accommodate rigid attachment to said body, said arm's second end is formed to engage the object said clamp is to be positioned on and said arm's length is generally curved to extend the said arm's second end away from said body and generally in line with and at predetermined distance from said clamp; and said arm rigidly attached to said body between the first and second apertures generally proximate to said first aperture.

7. The assembly according to claim 6, wherein said body's middle area is formed to clock said first end a predetermined number of degrees relative to said second end generally on a reference axis of a line from the center of said aperture one to the center of said aperture two.

8. The assembly according to claim 6, wherein said body's middle area is formed to clock said first end a predetermined number of degrees relative to said second end generally on a first reference axis of a line from the center of said aperture one to the center of said aperture two; and said middle area is further formed a predetermined number of degrees generally on a second reference axis, generally in the center of said middle area and generally perpendicular to said first reference axis.

9. The assembly according to claim 6, having at least a third aperture there through generally in said first end, wherein said aperture(s) is adapted to receive a mechanical fasting means to attach said arm.

10. The assembly according to claim 6, wherein said body and arm forming a unitary member.

11. The assembly according to claim 6, wherein said rigid region consists of a clamp of a hot line grounding set.

* * * * *